United States Patent
Makhija et al.

(10) Patent No.: US 8,125,229 B2
(45) Date of Patent: Feb. 28, 2012

(54) BATTERY TESTING AND CHARGING SYSTEM AND METHOD OF OPERATION THEREOF

(75) Inventors: Surender Makhija, Brookfield, WI (US); Garret Miller, Owatonna, MN (US)

(73) Assignee: SPX Corportaion, Charlotte, NC (US)

( * ) Notice: Subject to any disclaimer, the term of this patent is extended or adjusted under 35 U.S.C. 154(b) by 602 days.

(21) Appl. No.: 12/269,919

(22) Filed: Nov. 13, 2008

(65) Prior Publication Data

US 2010/0117603 A1 May 13, 2010

(51) Int. Cl.
*G01N 27/416* (2006.01)

(52) U.S. Cl. .......................................... 324/426

(58) Field of Classification Search ............. 324/426
See application file for complete search history.

(56) References Cited

U.S. PATENT DOCUMENTS 6,104,167 A    8/2000   Bertness et al.
(Continued)

*Primary Examiner* — M'baye Diao
(74) *Attorney, Agent, or Firm* — Baker & Hostetler LLP

(57) ABSTRACT

A battery testing and charging system that includes at least one battery testing device and at least one battery charging device, wherein the battery testing device is removable from the battery charging device and wherein the battery testing device may communicate with a plurality of battery charging devices. Also, a method of testing and charging a battery that may be implemented using, for example, the above-described battery testing and charging system.

18 Claims, 4 Drawing Sheets

U.S. PATENT DOCUMENTS

| | | | |
|---|---|---|---|
| 6,696,922 B1* | 2/2004 | Wong et al. | 340/7.32 |
| 2004/0054503 A1* | 3/2004 | Namaky | 702/183 |
| 2005/0162172 A1* | 7/2005 | Bertness | 324/426 |
| 2005/0211187 A1* | 9/2005 | Harman et al. | 119/721 |
| 2006/0006876 A1 | 1/2006 | Bertness | |
| 2006/0038572 A1* | 2/2006 | Philbrook | 324/426 |
| 2006/0192564 A1* | 8/2006 | Brown et al. | 324/426 |
| 2007/0024234 A1* | 2/2007 | Potter et al. | 320/104 |
| 2007/0210800 A1 | 9/2007 | Krampitz et al. | |
| 2008/0169818 A1* | 7/2008 | Lesesky et al. | 324/426 |

* cited by examiner

BATTERY TESTING AND CHARGING SYSTEM AND METHOD OF OPERATION THEREOF

FIELD OF THE INVENTION

The present invention relates generally to systems and devices designed to test and/or charge batteries. The present invention also relates generally to methods for testing and/or charging batteries.

BACKGROUND OF THE INVENTION

When the owner of a vehicle brings an allegedly defective vehicular battery to a mechanic shop or automotive repair center, a mechanic will typically first ensure that the battery is indeed defective. This is done to ensure that the problem is not somewhere else in the vehicle.

In order to conduct a diagnostic test on the battery, the mechanic uses either an independent tester and manual charger or a system that is an integrated combination of a battery testing device and a battery charging device. According to this currently available system, if the battery is diagnosed as having too low of a charge by the battery testing device, the battery charging device will commence charging the battery. Since the charging operation may take one hour, two hours or more, a low or discharged battery will prevent the mechanic from using any part of the system on another battery.

In view of the above, mechanic shops and automotive repair centers that regularly encounter multiple customers requesting battery diagnoses and/or charges at substantially the same time typically invest in multiple integrated battery testing and charging systems. Unfortunately, this leads to inefficiency since the battery testing procedure typically takes on the order of a minute or less to complete while, as mentioned above, the charging procedure may take hours.

SUMMARY OF THE INVENTION

At least in view of the above, it would be desirable to provide novel battery testing and charging systems wherein a single battery testing device could be used in conjunction with multiple battery charging devices. It would also be desirable to provide novel methods for testing and charging a batteries that allow for the use of a single battery testing device in conjunction with multiple battery charging devices.

The foregoing needs are met, to a great extent, by one or more embodiments of the present invention. According to one such embodiment, a battery testing and charging system is provided. The system includes a battery testing device and a battery charging device. The battery testing device includes a processor configured to perform a test on a battery when the battery is connected to the battery testing device. Once the test (or at least a portion of the test) is concluded, the battery testing device also includes a transmitter that is configured to transmit test data collected during the test. The battery charging device is separable from the battery testing device and includes a receiver configured to receive the test data (e.g., the appropriate charging data) from the battery testing device. The battery charging device also includes charging circuitry having a particular configuration. More specifically, the charging circuitry is configured such that, when the battery charging device is connected to the battery, the charging circuitry charges the battery based upon the test data.

In accordance with another embodiment of the present invention, a method of testing and charging a battery is provided. The method includes performing a test on a battery using a battery testing device when the battery is connected to the battery testing device. The method also includes transmitting from the battery testing device test data collected during the test. The method further includes receiving the test data in a battery charging device that is separable from the battery testing device. In addition, the method also includes charging the battery based upon the test data when the battery is connected to the battery charging device.

In accordance with yet another embodiment of the present invention, another battery testing and charging system is provided. The system includes means for testing a battery when the battery is connected to the means for testing. The system also includes means for charging the battery when the battery is connected to the means for charging, wherein the means for charging is separable from the means for testing. The system further includes means for transmitting test data collected by the means for testing during the test to the means for charging, wherein the means for charging is configured to receive the test data and to charge the battery based upon the test data.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
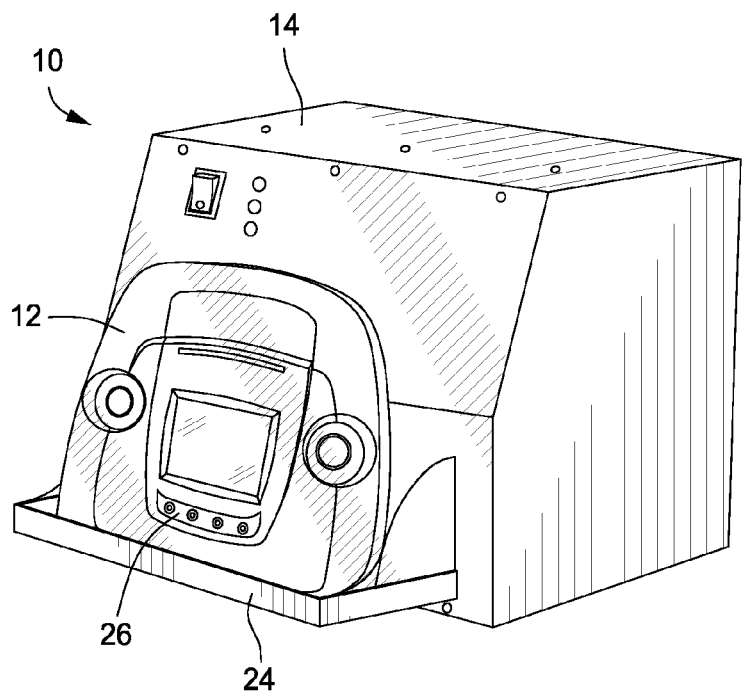
FIG. 1 is a perspective view of a battery testing and charging system according to an embodiment of the present invention.

The invention will now be described with reference to the drawing figures, in which like reference numerals refer to like parts throughout. FIG. 1 is a perspective view of a battery testing and charging system 10 according to an embodiment of the present invention. As illustrated in FIG. 1, the system 10 includes a battery testing device 12 and a battery charging device 14.

Figure 2:
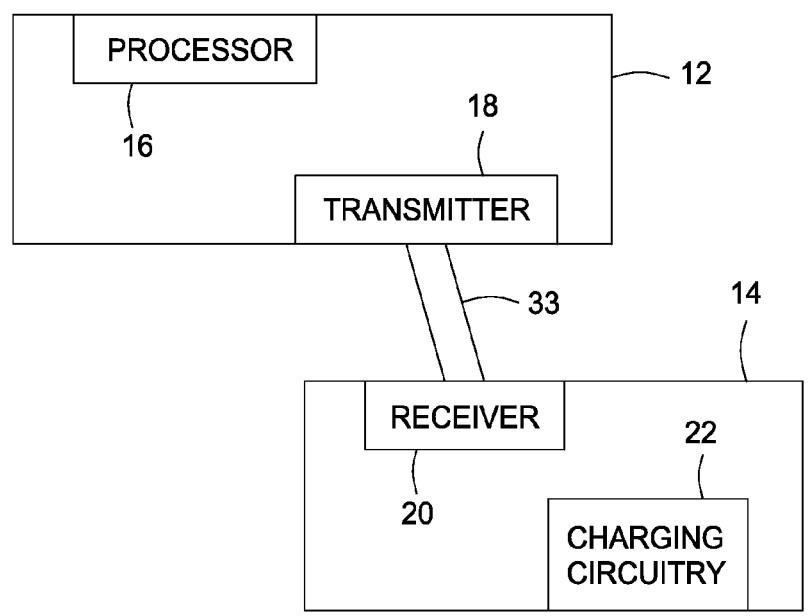
FIG. 2 is a schematic diagram of components included within a battery testing device and battery charging device according to an embodiment of the present invention.

FIG. 2 is a schematic diagram of components included within a battery testing device and battery charging device according to an embodiment of the present invention. As illustrated in FIG. 2, the battery testing device 12 includes a processor 16 and a transmitter 18. As also illustrated in FIG. 2, the battery charging device 14 includes a receiver 20 and charging circuitry 22. (It should be noted that, according to certain embodiments of the present invention, the transmitter 18 and/or the receiver 20 may be replaced by a transceiver.)

According to certain embodiments of the present invention, the processor 16 is configured to perform a test on a battery (not illustrated) when the battery is connected to the battery testing device 12. In some such embodiments, the transmitter 18 is configured to transmit test data collected during the test performed by the processor 16. Within the battery charging device 14, the receiver 20 is configured to receive the test data from the transmitter 18 within the data testing device 12. Then, the charging circuitry 22 is configured to charge the battery based upon the test data when the battery is connected to the battery charging device 14.

As illustrated in FIG. 1, according to certain embodiments of the present invention, the battery testing device 12, includes an operator interface 24. The operator interface 24 is configured to receive input from an operator of the battery testing device 12 (e.g., a mechanic) about at least one parameter of the battery. In FIG. 1, the operator interface 24 includes a plurality of buttons and knobs and a display screen. However, other methods of receiving input from an operator are also within the scope of the present invention.

Once the input is received from the operator, the battery testing device 12 is configured such that the input may be transmitted from the battery testing device 12 to the battery charging device 14. In such instances, the charging circuitry 22 is typically further configured to charge the battery based upon the input as well as the test data when the battery is connected to the battery charging device 14.

The above-discussed the input may be, for example, the rated voltage of the battery, the size of the battery, the type of battery, etc. The test data may be, for example, the battery charge level, the battery capacity, the time (i.e., length) of charge needed to obtain a desired level of charge (i.e., how long the battery should remain in the battery charging device 14), etc.

According to certain embodiments of the present invention, the processor 16 is configured to perform tests on more than just battery. For example, the processor 16 may, in some instances, the configured to perform tests on an electrical system of the vehicle from which the battery was removed when put into the battery charging device 14.

The battery testing and charging system 10 illustrated in FIG. 1 illustrates that, according to certain embodiments of the present invention, the battery testing device 12 is configured to be docked in a port 26 of the battery charging device 14. According to such embodiments, there is a direct link between the transmitter 18 and the receiver 20 that allows for communication between these two components.

According to certain embodiments of the present invention, docking the battery testing device 12 in the port 26 does more than facilitate and/or enable communication between the battery testing device 12 and the battery charging device 14. More specifically, while docked, the battery testing device 12 according to these embodiments also gets charged by the battery charging device 14.

Figure 3:
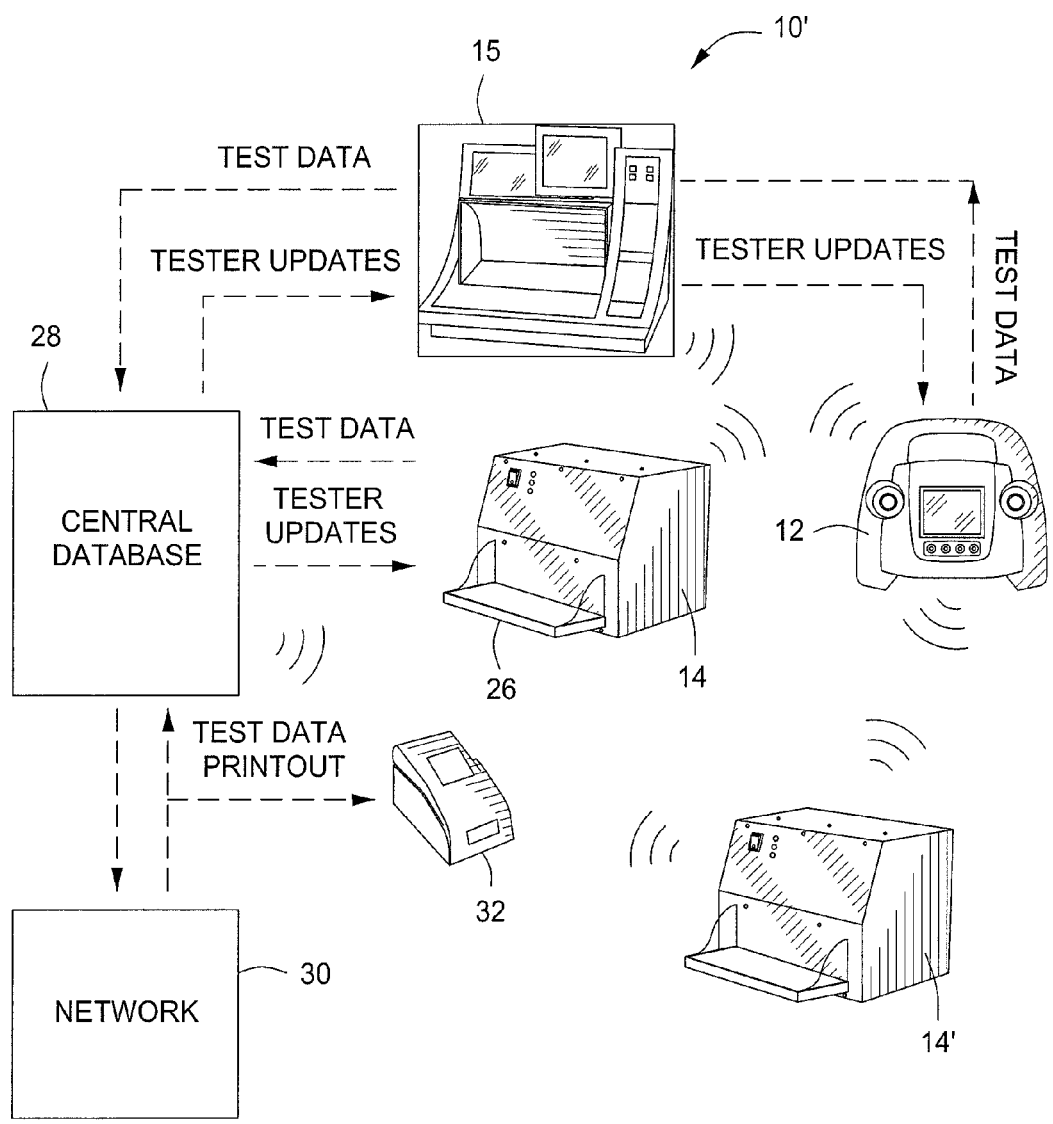
FIG. 3 is a schematic diagram of another battery testing and charging system according to an embodiment of the present invention.

FIG. 3 is a schematic diagram of a battery testing and charging system 10' according to another embodiment of the present invention. The system 10' is illustrated in FIG. 3 while in operation and includes not only the above-discussed battery testing device 12 and battery charging device 14 but also illustrates a second battery charging device 14', an additional network component 15, a central database 28, a network 30 and a printer 32. FIG. 3 also clearly illustrates that the battery testing device 12 is separable from each of the battery charging devices 14, 14'. (One of skill in the art will appreciate, upon reviewing FIG. 3 that the battery charging devices 14, 14' are models in which the battery testing device 12 may be docked and will further appreciate that the second battery charging device 14' can communicate wirelessly not only with the battery testing device 12 but also with any other component illustrated in FIG. 3).

The additional network component 15 illustrated in FIG. 3 takes the form of a rotating electrical tester. As such, alternators and/or starters may be tested therein. However, other devices are also within the scope of the present invention, including devices configured to communicate wirelessly with other components.

In operation, the battery testing device 12 may communicate with either of the battery charging devices 14, 14' or, according to certain embodiments of the present invention, with both. More specifically, the transmitter 18 in the battery testing device 12 illustrated in FIG. 3 communicates wirelessly with either or both of the receivers (e.g. receiver 20 in battery charging device 14) in the battery charging devices 14, 14'. Also, in addition to being docked in port 26 or communicating wirelessly, the above-mentioned transmitters and receivers may communicate utilizing one or more inter-connecting cables as illustrated in FIG. 2 with transmitter 18, receiver 20 and cable 33.

According to certain embodiments of the present invention, the central database 28 is configured to store test data and/or operator input for a plurality of battery tests. Although illustrated as a separate component in FIG. 3, the central database 28 may also be located in either a battery testing device or a battery charging device. Once enough data has been accumulated in the central database 28, a variety of statistical analyses may be performed to evaluate battery quality, reliability of the tester, efficiency of a charger, etc.

The network 30 illustrated in FIG. 3 maybe, for example, a local area network or the Internet. Although FIG. 3 illustrates that the battery testing device 12 communicates only with the battery charging devices 14, 14', that the battery charging devices 14, 14' communicate only with the central database 28 and the battery testing device 12, and that the network 30 communicates only with the central database 28 and the printer 32, other lines of communication between the components illustrated in FIG. 3 are also within scope of the present invention. It should also be noted that software (e.g., updates for the battery testing device 12, the battery charging devices 14, 14', the central database 28 and/or the printer 32 maybe easily disseminated throughout the battery testing and charging system 10' using the lines of communication illustrated in FIG. 3. Also, a mechanic has the opportunity to remotely turn off any of the battery charging devices 14, 14' either during or after a battery charge.

The printer 32 illustrated in FIG. 3 may be any device capable of generating documents (e.g., reports, lists of data, etc.). In addition, other components may be included in the battery testing and charging system 10'. For example, video monitors, remote operator interfaces and/or signal alarms indicating the completion of a charge may be included.

Figure 4:
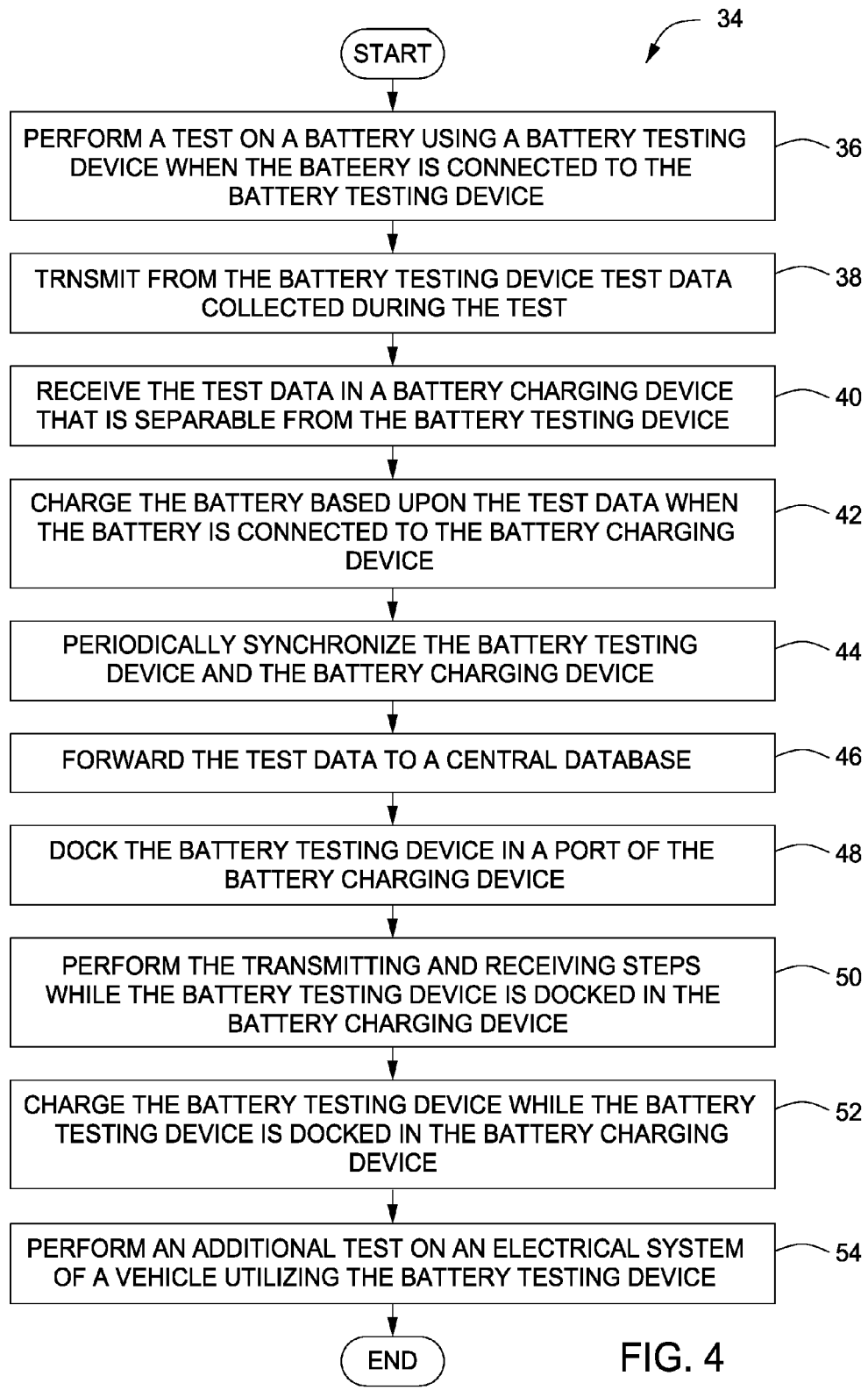
FIG. 4 is a flowchart illustrating the steps of a method of testing and charging a battery according to an embodiment of the present invention.

FIG. 4 is a flowchart illustrating the steps a method 34 of testing and charging a battery according to an embodiment of the present invention. The method specifies, in step 36 thereof, that a test may be performed on a battery using a battery testing device (e.g., device 12) when the battery is connected to the battery testing device. Although automotive batteries may become the primary beneficiaries of the systems and methods disclosed herein, it should be noted that supporting batteries included in motorcycles, industrial equipment, farm equipment, marine vehicles, etc. are also within the scope of the present invention.

Step 38 of method 34 specifies transmitting from the battery testing device test data was collected during the test. As will be appreciated by one of skill in the art upon practicing the present invention, the test data maybe transmitted on an intermittent basis or all at once at the conclusion of one or more tests. As will also be appreciated by one of skill in the art upon practicing the present invention, the transmission may occur while the battery testing device is docked in a port of a battery charging device, while connected to the battery testing device via a cable, wirelessly, etc.

Step 40 then specifies receiving the test data in a battery charging device (e.g., battery charging device 14, 14') that is separable from the battery testing device. As specified in step 42, once the data has been transferred, the charging of the battery may occur based upon the test data when the battery is connected to the battery charging device. According to certain embodiments of the present invention, the above-discussed input received from an operator and/or other parameters may be use by the battery charging device as well.

Step 44 specifies periodically synchronizing the battery testing devices and the battery charging devices. One benefit of such synchronization is the resultant increase in data reliability. Synchronization on a periodic basis may also be performed between other system components.

According to step 46, the test data is forwarded to a central database (e.g., database 28). Once in the database, the data maybe manipulated in any manner that would prove useful to owner or operator of a system according to the present invention. For example, statistical analysis may be performed.

Step 48 specifies docking the battery testing device in a port of the battery charging device. According to step 50, the above-mentioned transmitting and receiving steps may be performed while the battery testing device is docked in the battery charging device. According to step 52, the battery testing device may also be charged while the battery testing device is docked in the battery charging device. As an alternative, other methods may be used to charge the battery testing device. For example, batteries may be swapped out or the battery testing device may be plugged into an outlet.

In addition to the above-discussed testing of batteries, according to step 54, the battery testing device may also be utilized to perform one or more additional tests on one or more electrical systems of a vehicle. In other words, according to certain embodiments of the present invention, the battery testing device is configured to test vehicular components other than batteries.

Figure 5:
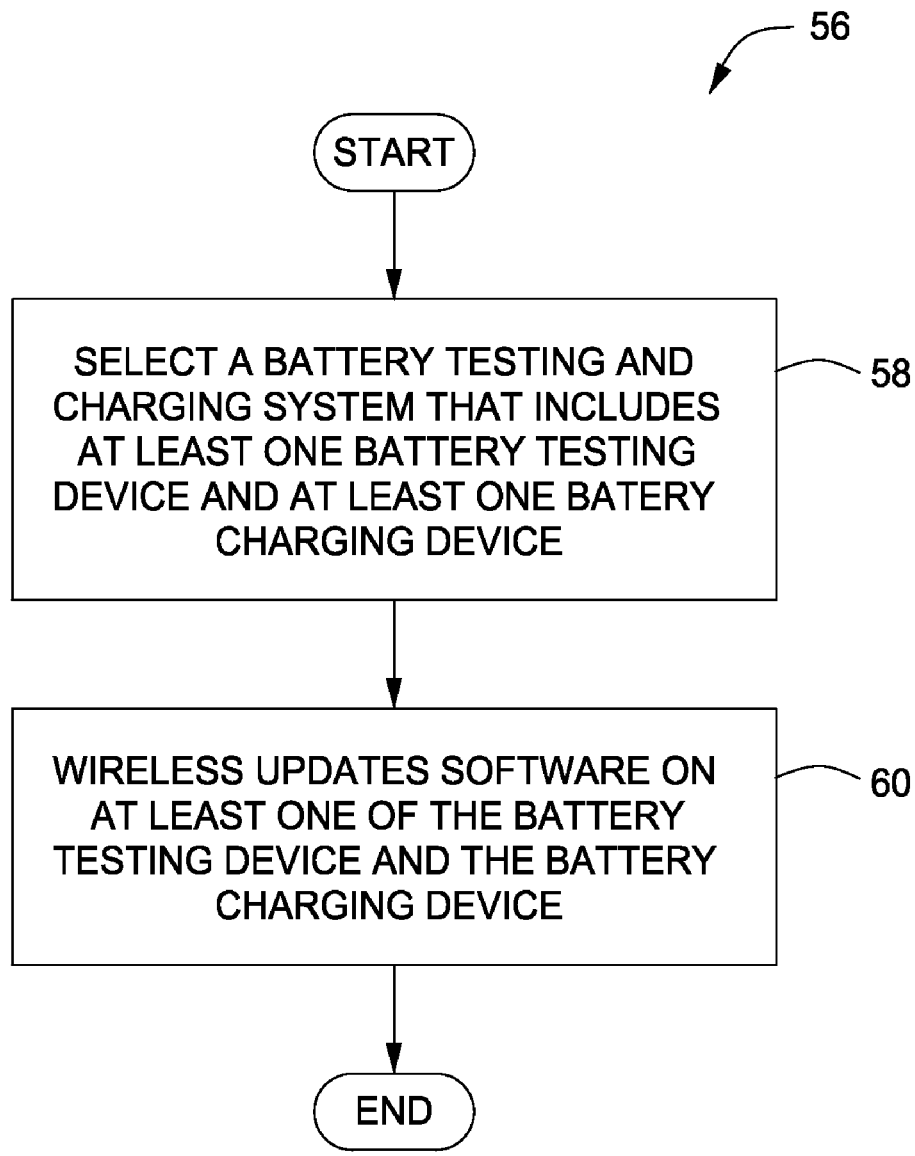
FIG. 5 is a flowchart illustrating the steps of a method of updating software according to an embodiment of the present invention.

FIG. 5 is a flowchart 56 illustrating the steps of a method of updating software according to an embodiment of the present invention. As specified in step 58, a battery testing and charging system that includes at least one battery testing device and at least one battery charging device is selected. For example, the system 10' discussed above may be selected during step 58. Then, according to step 60, software is wirelessly updated on at least one of the battery testing devices and/or the battery charging devices. In addition, such updates may be performed using cables and/or other means of connectivity. Also, using the method whose steps are illustrated in FIG. 5, updates may be made to the software of other components in a battery testing and charging system.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A battery testing and charging system, comprising:
a battery testing device that comprises:
a processor configured to perform a test on a battery when the battery is connected to the battery testing device, and a transmitter configured to transmit test data collected during the test; and
a battery charging device that is separable from the battery testing device and that comprises:
a receiver configured to receive the test data from the battery testing device, and charging circuitry configured to charge the battery based upon the test data when the battery is connected to the battery charging device, wherein the battery testing device is configured to be docked in a port of the battery charging device, thereby allowing communication between the transmitter and receiver.

2. The battery testing and charging system of claim 1, wherein the battery testing device further comprises:
an operator interface configured to receive input from an operator of the battery testing device about at least one parameter of the battery, wherein the input is transmitted from the battery testing device to the battery charging device and wherein the charging circuitry is further configured to charge the battery based upon the input as well as the test data when the battery is connected to the battery charging device.

3. The battery testing and charging system of claim 1, wherein the test data comprises at least one of:
a battery charge level, a battery capacity and a time of charge needed to obtain a desired level of charge.

4. The battery testing and charging system of claim 1, wherein the processor is further configured to perform an additional test on an electrical system of a vehicle.

5. The battery testing and charging system of claim 1, further comprising an additional battery charging device also in communication with the battery testing device.

6. The battery testing and charging system of claim 1, wherein the transmitter and receiver are configured to communicate with each other wirelessly.

7. The battery testing and charging system of claim 1, wherein the transmitter and receiver are configured to communicate with each other across a cable.

8. The battery testing and charging system of claim 1, wherein the battery charging device is configured to charge the battery testing device when docked.

9. The battery testing and charging system of claim 1, further comprising: a central database configured to store the test data.

10. A method of testing and charging a battery, the method comprising:
- performing a test on the battery using a battery testing device when the battery is connected to the battery testing device;
- transmitting from the battery testing device test data collected during the test;
- receiving the test data in a battery charging device that is separable from the battery testing device;
- docking the battery testing device in a port of the battery charging device;
- charging the battery testing device while the battery testing device is docked in the battery charging device: and
- charging the battery based upon the test data when the battery is connected to the battery charging device.

11. The method of claim 10, further comprising:
- wirelessly updating software on at least one of the battery testing device and the battery charging device.

12. The method of claim 10, wherein the transmitting and receiving steps are performed wirelessly.

13. The method of claim 12, further comprising:
- periodically synchronizing the battery testing device and the battery charging device.

14. The method of claim 10, further comprising:
- forwarding the test data to a central database.

15. The method of claim 10, wherein the transmitting step comprises transmitting the test data to one or more of a plurality of battery charging devices.

16. The method of claim 10, further comprising:
- performing the transmitting and receiving steps while the battery testing device is docked in the battery charging device.

17. The method of claim 10, further comprising:
- performing an additional test on an electrical system of a vehicle utilizing the battery testing device.

18. A battery testing and charging system, the system comprising:
- means for testing a battery when the battery is connected to the means for testing;
- means for charging the battery when the battery is connected to the means for charging, wherein the means for charging is separable from the means for testing; and
- means for transmitting test data collected by the means for testing during the test to the means for charging, wherein the means for charging is configured to receive the test data and to charge the battery based upon the test data, and wherein the means for testing is configured to be docked in a port of the means for charging and charged by the means for charging when docked.

* * * * *